(12) United States Patent
Yamada

(10) Patent No.: US 10,121,531 B2
(45) Date of Patent: Nov. 6, 2018

(54) SEMICONDUCTOR MEMORY

(71) Applicant: LAPIS Semiconductor Co., Ltd., Yokohama (JP)

(72) Inventor: Takashi Yamada, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/795,784

(22) Filed: Oct. 27, 2017

(65) Prior Publication Data

US 2018/0122455 A1    May 3, 2018

(30) Foreign Application Priority Data

Oct. 28, 2016  (JP) .................... 2016-212082

(51) Int. Cl.
| | |
|---|---|
| G11C 11/22 | (2006.01) |
| G11C 11/4091 | (2006.01) |
| G11C 5/06 | (2006.01) |
| G11C 5/10 | (2006.01) |
| G11C 7/06 | (2006.01) |
| G11C 11/408 | (2006.01) |
| G11C 11/4094 | (2006.01) |
| G11C 11/4097 | (2006.01) |
| G11C 5/02 | (2006.01) |
| G11C 7/02 | (2006.01) |
| G11C 7/12 | (2006.01) |
| G11C 7/18 | (2006.01) |

(52) U.S. Cl.
CPC .......... *G11C 11/4091* (2013.01); *G11C 5/025* (2013.01); *G11C 5/063* (2013.01); *G11C 5/10* (2013.01); *G11C 7/02* (2013.01); *G11C 7/06* (2013.01); *G11C 7/12* (2013.01); *G11C 7/18* (2013.01); *G11C 11/221* (2013.01); *G11C 11/2255* (2013.01); *G11C 11/2259* (2013.01); *G11C 11/2273* (2013.01); *G11C 11/4085* (2013.01); *G11C 11/4094* (2013.01); *G11C 11/4097* (2013.01)

(58) Field of Classification Search
CPC ... G11C 11/22; G11C 11/223; G11C 11/5657; G11C 14/00; H01L 27/11502
USPC ......................................... 365/145
See application file for complete search history.

(56) References Cited

U.S. PATENT DOCUMENTS

2011/0058403 A1*  3/2011  Hashimoto ............ G11C 11/22
                                                                       365/145

FOREIGN PATENT DOCUMENTS

| JP | S63-237290 A | 10/1988 |
| JP | 2001-135077 A | 5/2001 |
| JP | 2016-54012 A | 4/2016 |

* cited by examiner

*Primary Examiner* — Jason Lappas
(74) *Attorney, Agent, or Firm* — Rabin & Berdo, P.C.

(57) ABSTRACT

A semiconductor memory includes j×k first memory cells, j upper bit lines, (½)j sense amplifiers, j×k lower first bit lines, k first word lines, k pairs of plate lines, each pair having first and second plate lines, each being connected to odd-numbered and even-numbered first memory cells of one of the k columns, a pair of discharge signal lines having a first discharge signal line and a second discharge signal line respectively connecting two of the j upper lines in each sense amplifier to a prescribed potential, j×m second memory cells, j lower second bit lines, m second word lines, m third plate lines each connected to the j second memory cells of one of the m columns, and j shield lines each provided at positions respectively corresponding to the j upper bit lines, which are parallel to one another.

10 Claims, 4 Drawing Sheets

SEMICONDUCTOR MEMORY

TECHNICAL FIELD

The present invention relates to a semiconductor memory device.

BACKGROUND ART

As a non-volatile semiconductor storage device, a ferroelectric memory (ferroelectric random access memory: FeRAM) that uses a ferroelectric material as a capacitor is known. Ferroelectric memories are categorized into a 1T1C type in which data is read by comparing a reference signal and a signal from one memory cell constituted of a transistor and a ferroelectric capacitor, and a 2T2C type in which data is read by comparing complementary signals from a set of two memory cells (hereinafter referred to as complementary reading). In recent years, storage devices in which a 1T1C memory region and a 2T2C memory region coexist are known (Japanese Patent Application Laid-Open Publication No. 2016-54012, for example).

In a semiconductor memory such as a ferroelectric memory, a plurality of bit lines are provided in parallel with each other. As a result, when reading from the memory, adjacent bit lines interfere with each other, resulting in noise between the bit lines. This noise between the bit lines results in a decrease in the reading margin. In order to prevent a decrease in reading margin, a semiconductor memory was conceived of in which noise is evenly distributed among bit lines by a configuration in which bit lines forming a pair intersect with each other and other adjacent pairs of bit lines are at the same parallel distance (Japanese Patent Application Laid-Open Publication No. S63-237290, for example). Also, a method was conceived of in which bit lines adjacent to a selected bit line are deselected and kept at ground potential, thereby preventing noise between bit lines (Japanese Patent Application Laid-Open Publication No. 2001-135077, for example).

SUMMARY OF THE INVENTION

Among the conventional art, in the method of preventing a decrease in reading margin by evening out the noise among the bit lines, a separate wiring layer is required in order for the bit lines to intersect. Thus, the number of wiring layers increases, resulting in an increase in manufacturing costs as well as the area.

Also, while the method of preventing noise by setting deselected bit lines at ground potential is effective in the case of a memory where reading is performed using a reference signal (1T1C type), this method cannot be used for a memory in which complementary reading is performed, where there are no deselected bit lines (2T2C type). Therefore, this method could not be applied to a semiconductor memory that includes both a memory region where reading is performed using a reference signal and a memory region where complementary reading is performed.

In order to solve the above-mentioned problems, an object of the present invention is to provide a semiconductor memory having a memory region where complementary reading is performed and a memory region where reading using a reference signal is performed, in which it is possible to suppress an increase in the scale of the device while mitigating the occurrence of noise between bit lines.

According to an aspect of the invention, there is provided a semiconductor memory having a first memory region and a second memory region, including j×k first memory cells arranged in j rows and k columns in the first memory region, j being a positive even number, k being a natural number, j upper bit lines each connected to the k first memory cells of a corresponding one of the j rows, (½)j sense amplifiers each connected to two of the j upper bit lines, j×k lower first bit lines connected respectably to the j×k first memory cells, each of k of the j×k lower first bit lines connected to memory cells of one of the j rows being connected to a corresponding one of the j upper bit lines, k first word lines each connected to the j first memory cells of a corresponding one of the k columns, k pairs of plate lines, each pair having a first plate line and a second plate line, each said first plate line being connected to odd-numbered first memory cells of a corresponding one of the k columns, each said second plate line being connected to even-numbered first memory cells of a corresponding one of the k columns, a pair of discharge signal lines having a first discharge signal line, and a second discharge signal line respectively connecting the two of the j upper bit lines in each sense amplifier to a prescribed potential, j×m second memory cells arranged in j rows and m columns in the second memory region, the m second memory cells of a same row being connected to a corresponding one of the j upper bit lines, m being a natural number, j lower second bit lines each corresponding to one of the j upper bit lines, m second word lines each connected to the j second memory cells of a corresponding one of the m columns, m third plate lines each connected to the j second memory cells of a corresponding one of the m columns, and j shield lines each provided at positions respectively corresponding to the j upper bit lines and respectively adjacent to the j lower second bit lines, which are parallel to one another.

According to another aspect of the invention, there is provided a semiconductor memory having a first memory region and a second memory region, including j×k first memory cells arranged in j rows and k columns in the first memory region, j being a positive even number, k being a natural number, j upper bit lines each connected to the k first memory cells of a corresponding one of the j rows, (½)j sense amplifiers each connected to two of the j upper bit lines, j×k lower first bit lines connected respectably to the j×k first memory cells, k pairs of word lines, each pair having a first word line and a second word line, each said first word line being connected to odd-numbered first memory cells of a corresponding one of the k columns, each said second word line being connected to even-numbered first memory cells of the corresponding one of the k columns, a pair of discharge signal lines having a first discharge signal line, and a second discharge signal line selectively connecting the two of the j upper bit lines in each sense amplifier to a prescribed potential, j×m second memory cells arranged in j rows and m columns in the second memory region, the m second memory cells in a same row being connected to a corresponding one of the j upper bit lines, m being a natural number, j lower second bit lines each corresponding to one of the j upper bit lines, m third word lines each connected to the j second memory cells of a corresponding one of the m columns, and j shield lines each provided at positions respectively corresponding to the j upper bit lines and respectively adjacent to the j lower second bit lines, which are parallel to one another.

In the semiconductor memory of the present invention, in a memory region where reading is performed using a reference signal, one of the pair of upper bit lines can be fixed to ground potential, thereby reducing noise between the bit lines, and in a memory region where complementary reading is performed, shield lines are provided instead of upper bit lines, thereby reducing noise. By providing the lower bit lines, the upper bit lines, and the shield lines in the same wiring layer and in separate positions, it is possible to suppress the propagation of noise between bit lines while mitigating an increase in the size of the device.

DETAILED DESCRIPTION OF EMBODIMENTS

Figure 1:
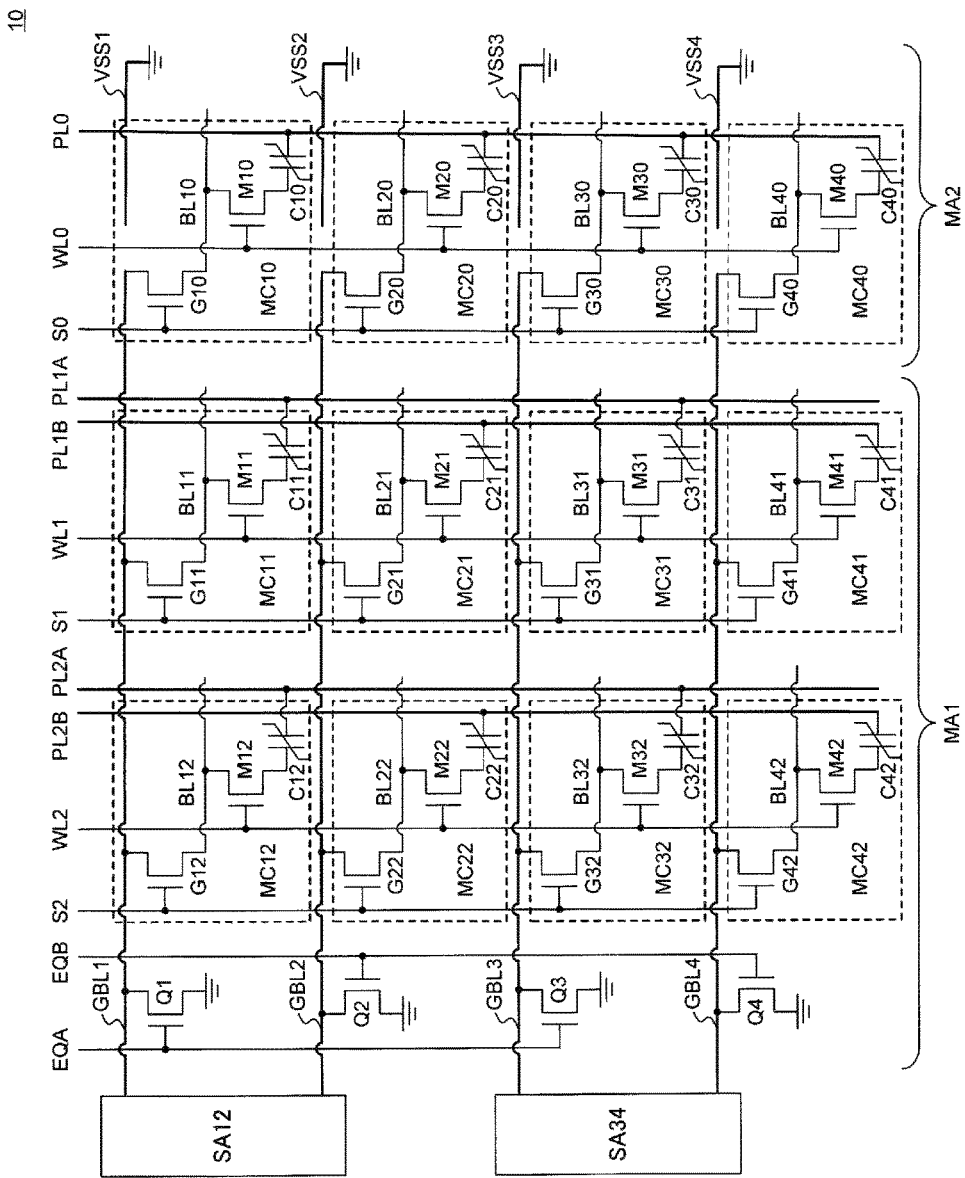
FIG. 1 is a block diagram showing a configuration of semiconductor memory 10 according to Embodiment 1.

Embodiments of the present invention will be explained below with reference to the drawings. In the description of embodiments and the affixed drawings below, parts that are substantially the same or equivalent are assigned the same reference characters.

Embodiment 1

FIG. 1 is a circuit block diagram showing a semiconductor memory 10 according to the present invention. The semiconductor memory 10 has a first memory region MA1 and a second memory region MA2.

The first memory region MA1 has pairs of plate lines connected alternately to memory cells arranged in the column direction, and is a memory region where data is read by comparing a signal from a memory cell with a reference signal (hereinafter referred to as reading using a reference signal). The second memory region MA2 has one plate line connected to the memory cells arranged in the column direction, and is a memory region where data is read by comparing complementary signals from pairs of memory cells (hereinafter referred to as complementary reading). In other words, the first memory region MA1 is a so-called 1T1C-type memory region, and the second memory region MA2 is a so-called 2T2C-type memory region.

In the first memory region MA1, upper bit lines GBL1 to GBL4 are formed parallel to each other. The upper bit lines GBL1 and GBL2 are connected to a sense amplifier SA12, and the upper bit lines GBL3 and GBL4 are connected to a sense amplifier SA34.

Also, the first memory region MA1 is provided with lower bit lines BL11, BL12, BL21, BL22, BL31, BL32, BL41, and BL42. The lower bit lines BL11, BL12, BL21, BL22, BL31, BL32, BL41, and BL42 are connected to the upper bit lines GBL1 to GBL4. The lower bit lines BL11 and BL12 are connected to the upper bit line GBL1, and are provided so as to be parallel and adjacent to the upper bit line GBL1. The lower bit lines BL21 and BL22 are connected to the upper bit line GBL2, and are provided so as to be parallel and adjacent to the upper bit line GBL2. The lower bit lines BL31 and BL32 are connected to the upper bit line GBL3, and are provided so as to be parallel and adjacent to the upper bit line GBL3. The lower bit lines BL41 and BL42 are connected to the upper bit line GBL4, and are provided so as to be parallel and adjacent to the upper bit line GBL4.

Additionally, in the first memory region MA1 word lines WL1 and WL2 and plate lines PL1A, PL1B, PL2A, and PL2B are formed so as to intersect with the upper bit lines GBL1 to GBL4. The plate lines PL1A and PL2A are arranged adjacent to each other and form a plate line pair, for example. Similarly, the plate lines PL1B and PL2B are arranged adjacent to each other and form a plate line pair, for example. The word lines (WL1, WL2) and the plate line pairs (PL1A and PL1B, PL2A and PL2B) are arranged in parallel with each other. Also, in the first memory region MA1, upper bit line discharge signal lines EQA and EQB and bit line selection signal lines S1 and S2 are arranged in parallel with the word lines and the plate line pairs.

Additionally, the first memory region MA1 has upper bit line discharge transistors Q1, Q2, Q3, and Q4, bit line selection transistors G11, G12, G21, G22, G31, G32, G41, and G42, memory cell transistors M11, M12, M21, M22, M31, M32, M41, and M42, and ferroelectric capacitors C11, C12, C21, C22, C31, C32, C41, and C42. Each transistor is an N-channel MOS transistor, for example.

In the upper bit line discharge transistor Q1, the gate terminal is connected to the upper bit line discharge signal line EQA, the source terminal is grounded, and the drain terminal is connected to the upper bit line GBL1. In the upper bit line discharge transistor Q2, the gate terminal is connected to the upper bit line discharge signal line EQB, the source terminal is grounded, and the drain terminal is connected to the upper bit line GBL2. In the upper bit line discharge transistor Q3, the gate terminal is connected to the upper bit line discharge signal line EQA, the source terminal is grounded, and the drain terminal is connected to the upper bit line GBL3. In the upper bit line discharge transistor Q4, the gate terminal is connected to the upper bit line discharge signal line EQB, the source terminal is grounded, and the drain terminal is connected to the upper bit line GBL4.

The bit line selection transistor G11, the memory cell transistor M11, and the ferroelectric capacitor C11 constitute a memory cell MC11 (indicated with dotted line in drawing) (first array). In the bit line selection transistor G11, the gate terminal is connected to the bit line selection signal line S1, the source terminal is connected to the lower bit line BL11, and the drain terminal is connected to the upper bit line GBL1. In the memory cell transistor M11, the gate terminal is connected to the word line WL1, the source terminal is connected to a first terminal of the ferroelectric capacitor C11, and the drain terminal is connected to the lower bit line BL11. A second terminal of the ferroelectric capacitor C11 is connected to the plate line PL1A.

The bit line selection transistor G12, the memory cell transistor M12, and the ferroelectric capacitor C12 constitute a memory cell MC12 (indicated with dotted line in drawing) (second array). In the bit line selection transistor G12, the gate terminal is connected to the bit line selection signal line S2, the source terminal is connected to the lower bit line BL12, and the drain terminal is connected to the upper bit line GBL1. In the memory cell transistor M12, the gate terminal is connected to the word line WL2, the source terminal is connected to a first terminal of the ferroelectric capacitor C12, and the drain terminal is connected to the lower bit line BL12. A second terminal of the ferroelectric capacitor C12 is connected to the plate line PL2A.

The bit line selection transistor G21, the memory cell transistor M21, and the ferroelectric capacitor C21 constitute a memory cell MC21 (indicated with dotted line in drawing). In the bit line selection transistor G21, the gate terminal is connected to the bit line selection signal line S1, the source terminal is connected to the lower bit line BL21, and the drain terminal is connected to the upper bit line GBL2. In the memory cell transistor M21, the gate terminal is connected to the word line WL1, the source terminal is connected to a first terminal of the ferroelectric capacitor C21, and the drain terminal is connected to the lower bit line BL21. A second terminal of the ferroelectric capacitor C21 is connected to the plate line PL1B.

The bit line selection transistor G22, the memory cell transistor M22, and the ferroelectric capacitor C22 constitute a memory cell MC22 (indicated with dotted line in drawing). In the bit line selection transistor G22, the gate terminal is connected to the bit line selection signal line S2, the source terminal is connected to the lower bit line BL22, and the drain terminal is connected to the upper bit line GBL2. In the memory cell transistor M22, the gate terminal is connected to the word line WL2, the source terminal is connected to a first terminal of the ferroelectric capacitor C22, and the drain terminal is connected to the lower bit line BL22. A second terminal of the ferroelectric capacitor C22 is connected to the plate line PL2B.

The bit line selection transistor G31, the memory cell transistor M31, and the ferroelectric capacitor C31 constitute a memory cell MC31 (indicated with dotted line in drawing). In the bit line selection transistor G31, the gate terminal is connected to the bit line selection signal line S1, the source terminal is connected to the lower bit line BL31, and the drain terminal is connected to the upper bit line GBL3. In the memory cell transistor M31, the gate terminal is connected to the word line WL1, the source terminal is connected to a first terminal of the ferroelectric capacitor C31, and the drain terminal is connected to the lower bit line BL31. A second terminal of the ferroelectric capacitor C31 is connected to the plate line PL1A.

The bit line selection transistor G32, the memory cell transistor M32, and the ferroelectric capacitor C32 constitute a memory cell MC32 (indicated with dotted line in drawing). In the bit line selection transistor G32, the gate terminal is connected to the bit line selection signal line S2, the source terminal is connected to the lower bit line BL32, and the drain terminal is connected to the upper bit line GBL3. In the memory cell transistor M32, the gate terminal is connected to the word line WL2, the source terminal is connected to a first terminal of the ferroelectric capacitor C32, and the drain terminal is connected to the lower bit line BL32. A second terminal of the ferroelectric capacitor C32 is connected to the plate line PL2A.

The bit line selection transistor G41, the memory cell transistor M41, and the ferroelectric capacitor C41 constitute a memory cell MC41 (indicated with dotted line in drawing). In the bit line selection transistor G41, the gate terminal is connected to the bit line selection signal line S1, the source terminal is connected to the lower bit line BL41, and the drain terminal is connected to the upper bit line GBL4. In the memory cell transistor M41, the gate terminal is connected to the word line WL1, the source terminal is connected to a first terminal of the ferroelectric capacitor C41, and the drain terminal is connected to the lower bit line BL41. A second terminal of the ferroelectric capacitor C41 is connected to the plate line PL1B.

The bit line selection transistor G42, the memory cell transistor M42, and the ferroelectric capacitor C42 constitute a memory cell MC42 (indicated with dotted line in drawing). In the bit line selection transistor G42, the gate terminal is connected to the bit line selection signal line S2, the source terminal is connected to the lower bit line BL42, and the drain terminal is connected to the upper bit line GBL4. In the memory cell transistor M42, the gate terminal is connected to the word line WL2, the source terminal is connected to a first terminal of the ferroelectric capacitor C42, and the drain terminal is connected to the lower bit line BL42. A second terminal of the ferroelectric capacitor C42 is connected to the plate line PL2B.

The plate line PL1A is connected to the ferroelectric capacitors C11 and C31, and the plate line PL1B is connected to the ferroelectric capacitors C21 and C41. The plate line PL2A is connected to the ferroelectric capacitors C12 and C32, and the plate line PL2B is connected to the ferroelectric capacitors C22 and C42. In other words, the plate lines forming pairs (PL1A and PL1B, PL2A and PL2B) are connected to every other ferroelectric capacitor.

The upper bit line discharge signal line EQA is connected to the upper bit line discharge transistors Q1 and Q3. The upper bit line discharge signal line EQB is connected to the upper bit line discharge transistors Q2 and Q4. In other words, the upper bit line discharge signal lines forming a pair (EQA and EQB) are connected to every other upper bit line discharge transistor.

Once the upper bit line discharge signal line EQA becomes high and the upper bit line discharge transistors Q1 and Q3 turn on, the upper bit lines GBL1 and GBL3 are connected to ground potential (GND). On the other hand, once a signal level of the upper bit line discharge signal line EQB becomes high and the upper bit line discharge transistors Q2 and Q4 turn on, the upper bit lines GBL2 and GBL4 are connected to ground potential (GND). In other words, the upper bit line discharge signal lines EQA and EQB are a pair of discharge signal lines configured such that it is possible to connect the first and second upper bit lines separately to ground potential (GND), the two upper bit lines constituting the pair of upper bit lines (GBL1 and GBL2, GBL3 and GBL4) connected to each sense amplifier (SA12, SA34).

In the second memory region MA1, a bit line selection signal line S0, a word line WL0, and a plate line PL0 are formed parallel to each other. Lower bit lines BL10, BL20, BL30, and BL40 are formed so as to intersect with the word line WL0 and the plate line PL0.

Upper bit lines GBL1 to GBL4 do not extend to a position adjacent to the lower bit lines BL10, BL20, BL30, and BL40, and instead, shield lines VSS1, VSS2, VSS3, and VSS4 that are kept at ground potential (GND) are provided. The shield lines VSS1, VSS2, VSS3, and VSS4 are arranged parallel and adjacent to the lower bit lines BL10, BL20, BL30, and BL40, respectively.

The second memory region MA2 has bit line selection transistors G10, G20, G30, and G40, memory cell transistors M10, M20, M30, and M40, and ferroelectric capacitors C10, C20, C30, and C40. Each transistor is an N-channel MOS transistor, for example.

The bit line selection transistor G10, the memory cell transistor M10, and the ferroelectric capacitor C10 constitute a memory cell MC10 (indicated with dotted line in drawing). In the bit line selection transistor G10, the gate terminal is connected to the bit line selection signal line S0, the source terminal is connected to the lower bit line BL10, and the drain terminal is connected to the upper bit line GBL1. In the memory cell transistor M10, the gate terminal is connected to the word line WL0, the source terminal is connected to a first terminal of the ferroelectric capacitor C10, and the drain terminal is connected to the lower bit line BL10. A second terminal of the ferroelectric capacitor C10 is connected to the plate line PL0.

The bit line selection transistor G20, the memory cell transistor M20, and the ferroelectric capacitor C20 constitute a memory cell MC20 (indicated with dotted line in drawing). In the bit line selection transistor G20, the gate terminal is connected to the bit line selection signal line S0, the source terminal is connected to the lower bit line BL20, and the drain terminal is connected to the upper bit line GBL2. In the memory cell transistor M20, the gate terminal is connected to the word line WL0, the source terminal is connected to a first terminal of the ferroelectric capacitor C20, and the drain terminal is connected to the lower bit line BL20. A second terminal of the ferroelectric capacitor C20 is connected to the plate line PL0.

The bit line selection transistor G30, the memory cell transistor M30, and the ferroelectric capacitor C30 constitute a memory cell MC30 (indicated with dotted line in drawing). In the bit line selection transistor G30, the gate terminal is connected to the bit line selection signal line S0, the source terminal is connected to the lower bit line BL30, and the drain terminal is connected to the upper bit line GBL3. In the memory cell transistor M30, the gate terminal is connected to the word line WL0, the source terminal is connected to a first terminal of the ferroelectric capacitor C30, and the drain terminal is connected to the lower bit line BL30. A second terminal of the ferroelectric capacitor C30 is connected to the plate line PL0.

The bit line selection transistor G40, the memory cell transistor M40, and the ferroelectric capacitor C40 constitute a memory cell MC40 (indicated with dotted line in drawing). In the bit line selection transistor G40, the gate terminal is connected to the bit line selection signal line S0, the source terminal is connected to the lower bit line BL40, and the drain terminal is connected to the upper bit line GBL4. In the memory cell transistor M40, the gate terminal is connected to the word line WL0, the source terminal is connected to a first terminal of the ferroelectric capacitor C40, and the drain terminal is connected to the lower bit line BL40. A second terminal of the ferroelectric capacitor C40 is connected to the plate line PL0.

As described above, the lower bit lines BL10, BL20, BL30, and BL40 are not adjacent to the upper bit lines GBL1, GLB2, GLB3, and GLB4, and instead, shield lines VSS1, VSS2, VSS3, and VSS4 are provided adjacent thereto.

In the semiconductor memory 10, the lower bit lines BL10, BL11, BL12, BL20, BL21, BL22, BL30, BL31, BL32, BL40, BL41, and BL42, the upper bit lines GBL1, GLB2, GLB3, and GLB4, and the shield lines VSS1, VSS2, VSS3, and VSS4 are all formed in the same wiring layer.

Also, the shield lines VSS1, VSS2, VSS3, and VSS4 are provided apart from the upper bit lines GBL1, GBL2, GBL3, and GBL4 but on imaginary lines extending therefrom.

Next, the memory reading operation in the semiconductor memory 10 will be described for the first memory region MA1 and the second memory region MA2.

First, the reading operation for the first memory region MA1 will be described. In the first memory region MA1, reading is performed using a reference signal. A reference signal (not shown) is inputted to the sense amplifiers SA12 and SA34, and a read-out signal outputted from the upper bit lines of the memory cell is compared with the reference signal.

When a signal level of one of the bit line selection signal lines S1 and S2 becomes high, bit lines are selected. If a signal level of the bit line selection signal line S1 becomes high, then the lower bit lines BL11, BL21, BL31, and BL41 are selected, and if a signal level of the bit line selection signal line S2 becomes high, then the lower bit lines BL12, BL22, BL32, and BL42 are selected, for example.

When a signal level of the word line WL1 or WL2 corresponding to the selected bit line becomes high, ferroelectric capacitors are selected. If the lower bit lines BL11, BL21, BL31, and BL41 are selected and a signal level of the word line WL1 becomes high, then the ferroelectric capacitors C11, C21, C31, and C41 are selected, for example. If the lower bit lines BL12, BL22, BL32, and BL42 are selected and a signal level of the word line WL2 becomes high, then the ferroelectric capacitors C12, C22, C32, and C42 are selected.

The selected ferroelectric capacitors are electrically connected to the upper bit lines. The ferroelectric capacitors C11 and C12 are electrically connected to the upper bit line GBL1, the ferroelectric capacitors C21 and C22 are electrically connected to the upper bit line GBL2, the ferroelectric capacitors C31 and C32 are electrically connected to the upper bit line GBL3, and the ferroelectric capacitors C41 and C42 are electrically connected to the upper bit line GBL4, for example.

Next, when a signal level of one plate line among the plate line pairs (PL1A and PL1B, PL2A and PL2B) becomes high, then a read-out signal is outputted from the ferroelectric capacitor connected to the started up plate line to the upper bit line. The read-out signal is outputted to odd-numbered upper bit lines (GBL1 and GBL3) or even-numbered upper bit lines (GBL2 and GBL4). When a signal level of the plate line PL1A becomes high, for example, then the read-out signal from the ferroelectric capacitor C11 is outputted to the upper bit line GBL1, and the read-out signal from the ferroelectric capacitor C31 is outputted to the upper bit line GBL3. When a signal level of the plate line PL1B becomes high, then the read-out signal from the ferroelectric capacitor C21 is outputted to the upper bit line GBL2, and the read-out signal from the ferroelectric capacitor C41 is outputted to the upper bit line GBL4. When a signal level of the plate line PL2A becomes high, then the read-out signal from the ferroelectric capacitor C12 is outputted to the upper bit line GBL1, and the read-out signal from the ferroelectric capacitor C32 is outputted to the upper bit line GBL3. When a signal level of the plate line PL2B becomes high, then the read-out signal from the ferroelectric capacitor C22 is outputted to the upper bit line GBL2, and the read-out signal from the ferroelectric capacitor C42 is outputted to the upper bit line GBL4.

Meanwhile, the ferroelectric capacitors connected to plate lines that were not started up are also electrically connected to the upper bit lines. Therefore, the upper bit line discharge signal lines EQA and EQB are used to fix these upper bit lines (upper bit lines connected to non-selected ferroelectric capacitors) to ground potential (GND) in advance. In this manner, data stored in ferroelectric capacitors on which reading is not performed is not damaged.

By operating the upper bit line discharge signal line and the plate line in conjunction with each other, the upper bit line is fixed at ground potential (GND). If a signal level of the plate line PL1A or PL2A becomes high, for example, then the upper bit line discharge signal line EQB causes the upper bit lines GBL2 and GBL4 to be fixed at ground potential (GND). On the other hand, if a signal level of the plate line PL1B or PL2B becomes high, then the upper bit line discharge signal line EQA causes the upper bit lines GBL1 and GBL3 to be fixed at ground potential (GND).

Thus, in the first memory region MA1, a read-out signal is outputted to one of the two upper bit lines connected to the same sense amplifier, and the other upper bit line is fixed at ground potential (GND). Therefore, it is possible to block or reduce noise between lower bit lines and between upper bit lines (below, the phrase "between bit lines" will be used to collectively refer to both cases).

Next, the reading operation for the second memory region MA2 will be described. In the first memory region MA2, complementary reading is performed.

When a signal level of the bit line selection signal line S0 becomes high, the lower bit lines BL10, BL20, BL30, and BL40 are selected. If a signal level of the word line WL0 becomes high, then the ferroelectric capacitors C10, C20, C30, and C40 are selected.

Unlike the first memory region MA1, neither of the upper bit line discharge signal lines EQA and EQB is selected, and the upper bit lines GBL1, GBL2, GBL3, and GBL4 are not fixed at ground potential (GND).

Next, a signal level of the plate line PL0 becomes high. In this manner, the read-out signals from the ferroelectric capacitors C10, C20, C30, and C40 are outputted, respectively, to the upper bit lines GBL1, GBL2, GBL3, and GBL4.

The sense amplifier SA12 has supplied thereto read-out signals from the ferroelectric capacitors C10 and C20, and the sense amplifier A34 has supplied thereto read-out signals from the ferroelectric capacitors C30 and C40.

In this manner, complementary reading is performed. During writing, opposite logical values are written to C10 and C20, and C30 and C40 (that is, if 0 is written to one of the ferroelectric capacitors, then 1 is written to the other).

In the second memory region MA2, instead of upper bit lines, the shield lines VSS1 to VSS4 are provided adjacent to the lower bit lines BL10, BL20, BL30, and BL40. In this manner, transmission of noise from the selected lower bit lines BL10, BL20, BL30, and BL40 to other lower bit lines or to upper bit lines is greatly reduced. Therefore, it is possible to mitigate a reduction in reading margin resulting from noise.

The noise from the lower bit lines BL10, BL20, BL30, and BL40 includes a component that attenuates while passing through the bit line selection transistors G10, G20, G30, and G40, and that is propagated to the upper bit lines GBL1, GBL2, GBL3, and GBL4 and then radiated.

However, since the upper bit lines and the lower bit lines are formed in the same wiring layer, while complementary reading is performed in the second memory region MA2, there are non-selected lower bit lines (lower bit lines BL21 and BL22, for example) between adjacent upper bit lines (between upper bit lines GBL2 and GBL3, for example). These non-selected lower bit lines are at floating potential and not fixed at ground potential (GND), and form a wiring capacitance with wiring lines in upper and lower layers (not shown) and with the substrate (not shown). Also, these non-selected lower bit lines are connected to the memory transistors (M21, M22) and the bit line selection transistors (G21, G22), which are densely integrated, resulting in a high parasitic capacitance. The wiring capacitance and the parasitic capacitance work to block fluctuations in potential in the lower bit lines (BL21, BL22) resulting from noise between the upper bit lines (GBL2, GBL3). Therefore, the noise that would otherwise be propagated between the upper bit lines GBL2 and GBL3 can be effectively reduced by the wiring capacitance and parasitic capacitance of the non-selected lower bit lines BL21 and BL22. In other words, the lower bit lines BL21 and BL22 function as pseudo-shield lines against noise between the upper bit lines.

As described above, in the semiconductor memory 10 of the present embodiment, in the first memory region MA1 where reading is performed using a reference signal, a read-out signal is outputted to one of the two upper bit lines connected to the sense amplifier, and the other upper bit line is fixed at ground potential (GND), thereby preventing propagation of noise between the lower bit lines. Meanwhile, in the second memory region MA2 where complementary reading is performed, a shield line is provided adjacent to each lower bit line instead of the upper bit line, thereby mitigating the propagation of noise between the lower bit lines and noise between the upper bit lines. Therefore, in a semiconductor memory where a region where reading is performed using a reference signal and a region where complementary reading is performed coexist, the propagation of noise between the lower bit lines and between the upper bit lines can be mitigated, and a decrease in reading margin can be prevented.

Also, in the semiconductor memory 10 of the present embodiment, there is no need to provide another wiring layer or to cause the lower bit lines to intersect with each other in order to reduce noise, and thus, it is possible to reduce noise without an increase in chip area or manufacturing cost. Furthermore, there is no particular need to restrict the ratio of lengths of the upper bit lines and lower bit lines in order to reduce noise.

Additionally, in the semiconductor memory 10 of the present embodiment, noise is reduced, and only one each of the word line and plate line need to be selected for one reading operation. As a result, it is possible to prevent increased complexity in the circuit by providing a configuration for halving the number of sense amplifiers selected simultaneously or the like, and it is possible to reduce noise without increasing drive power.

Embodiment 2

Figure 2:
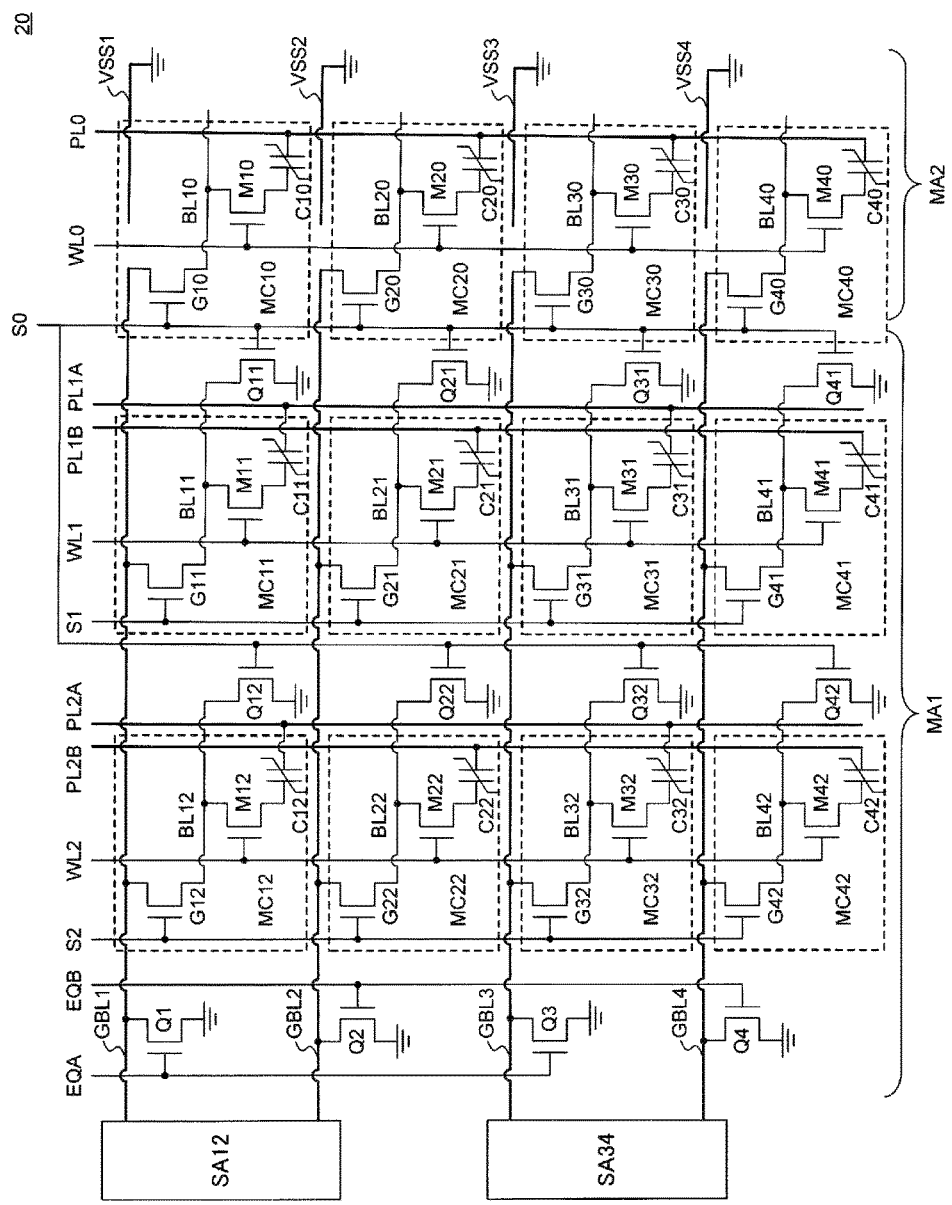
FIG. 2 is a block diagram showing a configuration of semiconductor memory 20 according to Embodiment 2.

FIG. 2 is a circuit block diagram showing a semiconductor memory 20 according to the present invention. The semiconductor memory 20 differs from the semiconductor memory 10 of Embodiment 1 by having bit line discharge transistors Q11, Q12, Q21, Q22, Q31, Q32, Q41, and Q42.

In the bit line discharge transistor Q11, the drain terminal is connected to a lower bit line BL11, and the source terminal is grounded. In the bit line discharge transistor Q21, the drain terminal is connected to a lower bit line BL21, and the source terminal is grounded. In the bit line discharge transistor Q31, the drain terminal is connected to a lower bit line BL31, and the source terminal is grounded. In the bit line discharge transistor Q41, the drain terminal is connected to a lower bit line BL41, and the source terminal is grounded. In the bit line discharge transistor Q12, the drain terminal is connected to a lower bit line BL12, and the source terminal is grounded. In the bit line discharge transistor Q22, the drain terminal is connected to a lower bit line BL22, and the source terminal is grounded. In the bit line discharge transistor Q32, the drain terminal is connected to a lower bit line BL32, and the source terminal is grounded. In the bit line discharge transistor Q42, the drain terminal is connected to a lower bit line BL42, and the source terminal is grounded.

The gate terminals of the bit line discharge transistors Q11, Q12, Q21, Q22, Q31, Q32, Q41, and Q42 are all connected to a bit line selection signal line S0. Thus, when performing reading in the second memory region MA2, when a signal level of the bit line selection signal line S0 becomes high, the lower bit lines BL11, BL12, BL21 BL22, BL31, BL32, BL41, and BL42 are all fixed at ground potential (GND). On the other hand, when performing reading in the first memory region MA1, the bit line selection signal line S0 is not started up (is not selected).

The bit line discharge transistors Q11, Q12, Q21, Q22, Q31, Q32, Q41, and Q42 are smaller transistors than the bit line selection transistors G10, G11, G12, G20, G21, G22, G30, G31, G32, G40, G41, and G42 in which a read-out current flows.

When performing complementary reading in the second memory region MA2, the lower bit lines BL11, BL12, BL21, BL22, BL31, BL32, BL41, and BL42 of the first memory region MA1, which are non-selected bit lines, are all fixed at ground potential (GND) through the bit line discharge transistors Q11, Q12, Q21, Q22, Q31, Q32, Q41, and Q42.

Therefore, when performing complementary reading, noise between upper bit lines can be more reliably suppressed than in the semiconductor memory 10 of Embodiment 1.

When performing reading using a reference signal in the first memory region MA1, the bit line selection signal line S0 is not selected, and thus, the bit line discharge transistors Q11, Q12, Q21, Q22, Q31, Q32, Q41, and Q42 are all off. Therefore, the effect of the bit line discharge transistors Q11, Q12, Q21, Q22, Q31, Q32, Q41, and Q42 on the read operation is minute, and the reading operation using the reference signal can be performed similarly to Embodiment 1.

As described above, in the semiconductor memory 20 of the present embodiment, when performing complementary reading in the second memory region MA2, the lower bit lines BL11, BL12, BL21, BL22, BL31, BL32, BL41, and BL42, which are non-selected bit lines, are all fixed at ground potential (GND). Thus, in addition to the reduction in noise by the shield lines VSS1 to VSS4 similar to Embodiment 1, the propagation of noise between the upper bit lines GBL1 to GBL4 can be reduced, and a decrease in the read margin can be more reliably prevented.

When performing reading using a reference signal in the first memory region MA1, the bit line discharge transistors Q11, Q12, Q21, Q22, Q31, Q32, Q41, and Q42 have almost no effect on the reading operation. Therefore, similar to Embodiment 1, it is possible to prevent a reduction in the read margin resulting from noise between the bit lines using non-selected upper bit lines fixed at ground potential (GND).

Embodiment 3

Figure 3:
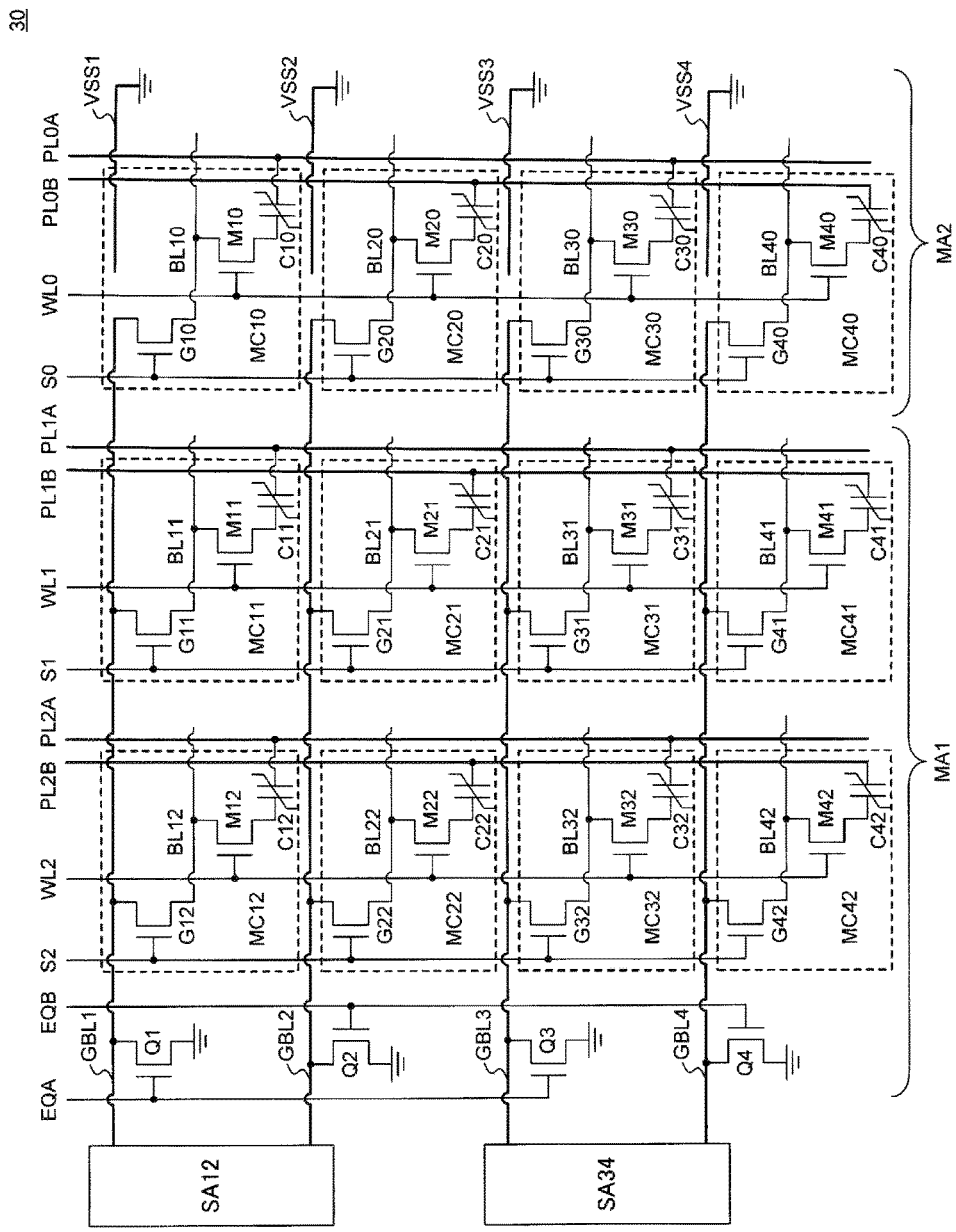
FIG. 3 is a block diagram showing a configuration of semiconductor memory 30 according to Embodiment 3.

FIG. 3 is a circuit block diagram showing a semiconductor memory 30 according to the present invention. The semiconductor memory 30 differs from the semiconductor memory 10 of Embodiment 1, which only has one plate line PL0 in the second memory region MA2, in that the semiconductor memory 30 has a pair of plate lines PL0A and PL0B in the second memory region MA2.

The plate line PL0A is connected to the second terminals (ends not connected to memory cell transistors) of ferroelectric capacitors C10 and C30. The plate line PL0B is connected to the second terminals of ferroelectric capacitors C20 and C40. In other words, in the semiconductor memory 10 of Embodiment 1, the ferroelectric capacitors C10, C20, C30, and C40 are all connected to the same plate line PL0, whereas in the semiconductor memory 30 of the present embodiment, every other ferroelectric capacitors C10, C20, C30, and C40 is connected alternately to the plate lines PL0A and PL0B.

The plate lines PL0A and PL0B can be individually or simultaneously started up. Therefore, by independently starting up each plate line PL0A and PL0B, it is possible to perform reading in the second memory region MA2 using the reference signal. Also, by simultaneously starting up both plate lines PL0A and PL0B, it is possible to perform complementary reading.

Thus, in the semiconductor memory 30, similar to the semiconductor memory 10 of Embodiment 1, in the first memory region MA1, a read-out signal is outputted to one of the two upper bit lines connected to the sense amplifier, and the other upper bit line is fixed at ground potential (GND). In this manner, in the first memory region MA1, mutual noise between bit lines is blocked, and the propagation of noise is prevented. Also, in the second memory region MA1, mutual noise between bit lines is blocked by the shield lines VSS1, VSS2, VSS3, and VSS4, and the propagation of noise is prevented.

In this manner, according to the semiconductor memory 30 of the present embodiment, it is possible to selectively perform complementary reading and reading using a reference signal in the second memory region MA2, while effectively reducing the propagation of noise between bit lines in the first memory region MA1 and the second memory region MA2, similar to the semiconductor memory 10 of Embodiment 1.

The number of memory cells required for complementary reading is double the number of memory cells required for reading using a reference signal. Thus, if the region for complementary reading is large, this results in an increase in area of the semiconductor memory as well as an increase in cost. To handle this issue, the region for complementary reading can be made small.

In the semiconductor memory 30 of the present embodiment, some of the memory group connected to the lower bit lines BL10, BL20, BL30, and BL40 is connected to the two plate lines, and the remaining portion is connected to one plate line. In this manner, it is possible to set a portion and not the entirety of the second memory region MA2 to be a complementary reading portion (region for complementary reading), thereby reducing the size of the complementary reading portion.

Also, it is possible to add the configuration of the semiconductor memory 20 of Embodiment 2 to the semiconductor memory 30 of the present embodiment. In the semiconductor memory 20 of Embodiment 2, the bit line discharge transistors Q11, Q12, Q21, Q22, Q31, Q32, Q41, and Q42 are provided in order to fix at ground potential (GND) the lower bit lines BL11, BL12, BL21, BL22, BL31, BL32, BL41, and BL42, which are non-selected bit lines, during complementary reading. On the other hand, when performing reading using a reference signal in the second memory region MA2 of the semiconductor memory 30 of the present embodiment, the lower bit lines BL11, BL12, BL21, BL22, BL31, BL32, BL41, and BL42 need not be fixed at ground potential (GND), but fixing these lines at ground potential (GND) has no effect on the read operation, and does not cause a reduction in reading margin. Thus, it is possible to attain the configuration of providing the bit line discharge transistors Q11, Q12, Q21, Q22, Q31, Q32, Q41, and Q42 as in Embodiment 2, while providing the pair of plate lines PL0A and PL0B in the second memory region MA2 as in the present embodiment.

Embodiment 4

Figure 4:
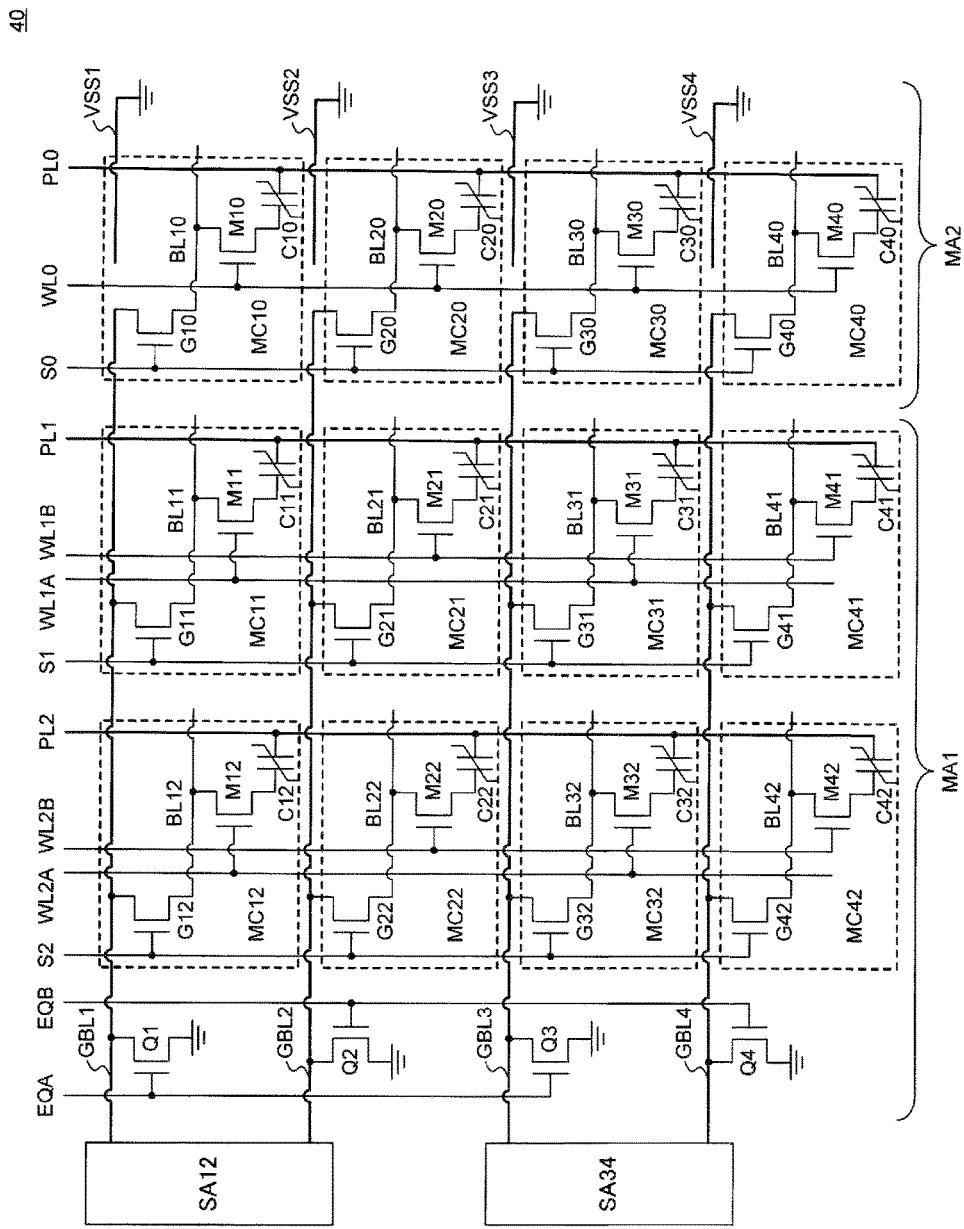
FIG. 4 is a block diagram showing a configuration of semiconductor memory 40 according to Embodiment 4.

FIG. 4 is a circuit block diagram showing a semiconductor memory 40 according to the present invention. The semiconductor memory 40 differs from the semiconductor memory 10 of Embodiment 1 in having plate lines PL1 and PL2 and pairs of word lines WL1A and WL1B, and WL2A and WL2B in the first memory region MA1. In other words, in the semiconductor memory 10 of Embodiment 1, pairs of plate lines (PL1A and PL1B, PL2A and PL2B) and word lines (WL1, WL2) corresponding thereto are provided, whereas in the semiconductor memory 40 of the present embodiment, pairs of word lines (WL1A and WL1B, WL2A and WL2B) and plate lines (PL1, PL2) corresponding thereto are provided.

The word line WL1A is connected to the gate terminal of a memory cell transistor M11 and the gate terminal of a memory cell transistor M31. The word line WL1B is connected to the gate terminal of a memory cell transistor M21 and the gate terminal of a memory cell transistor M41. In other words, every other memory cell transistor M11, M21, M31, and M41 is connected alternately to the word lines WL1A and WL1B.

The word line WL2A is connected to the gate terminal of a memory cell transistor M12 and the gate terminal of a memory cell transistor M32. The word line WL2B is connected to the gate terminal of a memory cell transistor M22 and the gate terminal of a memory cell transistor M42. In other words, every other memory cell transistor M12, M22, M32, and M42 is connected alternately to the word lines WL2A and WL2B.

When the word lines WL1A and WL2A are started up, an upper bit line discharge signal line EQB is selected. On the other hand, when the word lines WL1B and WL2B are started up, an upper bit line discharge signal line EQA is selected. In this manner, when performing reading using a reference signal, the word lines and the upper bit line discharge signal line operate in conjunction with each other.

According to the semiconductor memory 40 of the present embodiment, similar to the semiconductor memory 10 of Embodiment 1, when performing reading using a reference signal in the first memory region MA1, it is possible to reduce noise being propagated between the bit lines by fixing the non-selected upper bit lines at ground potential (GND). Also, when performing complementary reading in the second memory region MA2, it is possible to reduce noise being propagated between the bit lines by the shield lines VSS1 to VSS4.

Furthermore, the semiconductor memory 40 of the present embodiment can be applied to a semiconductor memory other than a ferroelectric memory. More specifically, in the semiconductor memories of Embodiments 1 to 3, a pair of plate lines was provided for each word line in the first memory region MA1, and the pair of plate lines was driven to perform a selection operation for memory cells. Semiconductor memories in which the plate lines are driven are largely limited to ferroelectric memories, and thus, the semiconductor memories of Embodiments 1 to 3 could realistically only be applied to ferroelectric memories. By contrast, the semiconductor memory 40 of the present embodiment has pairs of word lines, and the memory cells are selected by starting up the word lines. A configuration in which the memory cell is selected when a signal level of the word line becomes high, and the memory cell is not selected if the word line is not started up is similar to that of typical semiconductor memories. Therefore, by substituting in other elements and wiring lines for the ferroelectric capacitors C10, C11, C12, C20, C21, C22, C30, C31, C32, C40, C41, and C42 and the plate lines PL0 to PL2 of the semiconductor memory 40 of the present embodiment, it is possible to mitigate noise in a similar manner to the semiconductor memory 40 of the present embodiment in memories other than ferroelectric memories.

Also, it is possible to add the configuration of the semiconductor memory 20 of Embodiment 2 and the semiconductor memory 30 of Embodiment 3 to the semiconductor memory 40 of the present embodiment. For example, in the semiconductor memory 40 of the present embodiment, by forming a configuration similar to the memory cell group of the first memory region MA1 in which the group of memory cells connected to the lower bit lines BL10, BL20, BL30, and BL40 of the second memory region MA2 are alternately connected to the pairs of word lines, it is possible to attain a semiconductor memory in which the characteristics of the semiconductor memory 30 of Embodiment 3 and the semiconductor memory 40 of the present embodiment are combined.

As described above, in the semiconductor memory of the present invention, in the first memory region MA1 where reading is performed using a reference signal, the non-selected upper bit line among the pair of upper bit lines connected to the sense amplifier is fixed at ground potential, thereby reducing noise between the lower bit lines and between the upper bit lines. Also, in the second memory region MA2 where complementary reading is performed, a shield line is provided adjacent to each lower bit line instead of the upper bit line, thereby reducing noise between bit lines. By providing the lower bit lines, the upper bit lines, and the shield lines in the same wiring layer, it is possible to suppress the propagation of noise between bit lines while mitigating an increase in the size of the device.

The present invention is not limited to the embodiments above. For example, in the embodiments above, the non-selected upper bit lines, the non-selected lower bit lines, and the shield lines were fixed at ground potential (GND). However, the potential to which the wiring lines is fixed is not limited to ground potential, and may be any prescribed potential (fixed potential).

In the embodiments above, a configuration was described for the semiconductor memory in which one memory cell is connected to each lower bit line, three bit line selection transistors are connected to each upper bit line, two sense amplifiers are provided, and no upper bit line is present that extends to the left of the sense amplifiers. However, the drawings and descriptions are simplified, and the configuration of the semiconductor memory is not limited thereto.

Also, in the embodiments above, examples were described in which the plate lines PL1A and PL2A are adjacent to each other, and the plate lines PL1B and PL2B are adjacent to each other. However, the plate lines need not be disposed adjacent to each other as long as the plate lines form a pair.

In other words, the semiconductor memory of the present invention need only have a first memory region and a second memory region, with one of two upper bit lines connected to the sense amplifier being fixed at a prescribed potential such as ground potential in the first memory region, and the shield lines being provided adjacent to the lower bit lines instead of the upper bit lines in the second memory region. In the first memory region, the memory cells are arranged in j rows and k columns (j being a positive even number and k being a natural number), and j upper bit lines are connected to each of the k memory cells, for example. The word lines are provided for each column of memory cells, and each word line is connected to the memory cells arranged in the row direction. Each of the sense amplifiers is connected to two upper bit lines. The lower bit lines are connected to the upper bit lines. The pair of plate lines is constituted of a first plate line connected to memory cells in odd-numbered rows and a second plate line connected to memory cells in even-numbered rows. The pair of discharge signal lines is constituted of a first discharge signal line that can fix at a prescribed potential one of the two upper bit lines connected to each sense amplifier, and a second discharge signal line that can fix the other upper bit line at the prescribed potential. In the second memory region, the memory cells are arranged in j rows and m columns (m being a natural number), and m word lines are provided in the column direction of the memory cells, for example. The lower bit lines are connected to the upper bit lines of the first memory region. The plate lines are provided for each column of memory cells so as to intersect with the lower bit lines, and each word line is connected to the memory cells arranged in the row direction. The shield lines are provided in positions apart from the j upper bit lines of the first memory region, and each shield line is provided adjacent to each lower bit line.

Also, in Embodiments 1 to 3, the first memory region where reading is performed using a reference signal has a configuration where two plate lines are provided for each word line. However, plate lines corresponding to a few to a few dozen word lines may be bundled together to form one bundle, and even in such a configuration in which the plate lines are bundled, similar operations to those described in the embodiments above can be performed. In other words, the semiconductor memories of Embodiments 1 to 3 simply need to have a configuration in which word lines are shared and the plate lines that drive the two memory cells that can electrically connect to the differential input pair of one sense amplifier are separated and can be individually driven.

What is claimed is:

1. A semiconductor memory having a first memory region and a second memory region, comprising:
   j×k first memory cells arranged in j rows and k columns in the first memory region, j being a positive even number, k being a natural number;
   j upper bit lines each connected to the k first memory cells of a corresponding one of the j rows;
   (½)j sense amplifiers each connected to two of the j upper bit lines;
   j×k lower first bit lines connected respectably to the j×k first memory cells, each of k of the j×k lower first bit lines connected to memory cells of one of the j rows being connected to a corresponding one of the j upper bit lines;
   k first word lines each connected to the j first memory cells of a corresponding one of the k columns;
   k pairs of plate lines, each pair having a first plate line and a second plate line, each said first plate line being connected to odd-numbered first memory cells of a corresponding one of the k columns, each said second plate line being connected to even-numbered first memory cells of a corresponding one of the k columns;
   a pair of discharge signal lines having
      a first discharge signal line, and
      a second discharge signal line respectively connecting the two of the j upper bit lines in each sense amplifier to a prescribed potential;
   j×m second memory cells arranged in j rows and m columns in the second memory region, the m second memory cells of a same row being connected to a corresponding one of the j upper bit lines, m being a natural number;
   j lower second bit lines each corresponding to one of the j upper bit lines;
   m second word lines each connected to the j second memory cells of a corresponding one of the m columns;
   m third plate lines each connected to the j second memory cells of a corresponding one of the m columns; and
   j shield lines each provided at positions respectively corresponding to the j upper bit lines and respectively adjacent to the j lower second bit lines, which are parallel to one another.

2. The semiconductor memory according to claim 1, wherein
   each first memory cell includes
      a first memory cell transistor connected to one of the lower first bit lines, and
      a first ferroelectric capacitor connected to one of the first plate lines and the second plate lines, and
   each second memory cell includes
      a second memory cell transistor connected to another one of the lower second bit lines, and
      a second ferroelectric capacitor connected to one of the m plate lines.

3. The semiconductor memory according to claim 1, wherein the prescribed potential is ground potential.

4. The semiconductor memory according to claim 1, wherein the j shield lines are connected to a ground potential.

5. The semiconductor memory according to claim 1, wherein the j upper bit lines and the j shield lines are disposed in a same wiring layer.

6. The semiconductor memory according to claim 1, wherein each of the first memory cells includes a bit line discharge transistor that is connected to one of the lower first bit lines and connects the one of first bit lines connected there to the ground potential.

7. The semiconductor memory according to claim 1, wherein
   each of the third plate lines is connected to the second memory cells in odd-numbered rows of a corresponding one of the m columns, and
   the second memory region further includes m fourth plate lines each connected to the second memory cells in even-numbered rows of a corresponding one of the m columns.

8. The semiconductor memory according to claim 1, wherein the second memory region is disposed on a far end of the (½)j sense amplifiers of the first memory region.

9. The semiconductor memory according to claim 1, the j upper bit lines and the j×k lower first bit lines, the j lower second bit lines and the j shield lines are disposed in a same wiring layer.

10. A semiconductor memory having a first memory region and a second memory region, comprising:
    j×k first memory cells arranged in j rows and k columns in the first memory region, j being a positive even number, k being a natural number;
    j upper bit lines each connected to the k first memory cells of a corresponding one of the j rows;
    (½)j sense amplifiers each connected to two of the j upper bit lines;
    j×k lower first bit lines connected respectably to the j×k first memory cells;
    k pairs of word lines, each pair having a first word line and a second word line, each said first word line being connected to odd-numbered first memory cells of a corresponding one of the k columns, each said second word line being connected to even-numbered first memory cells of the corresponding one of the k columns;
    a pair of discharge signal lines having
       a first discharge signal line, and a second discharge signal line selectively connecting the two of the j upper bit lines in each sense amplifier to a prescribed potential;

j×m second memory cells arranged in j rows and m columns in the second memory region, the m second memory cells in a same row being connected to a corresponding one of the j upper bit lines, m being a natural number;

j lower second bit lines each corresponding to one of the j upper bit lines;

m third word lines each connected to the j second memory cells of a corresponding one of the m columns; and j shield lines each provided at positions respectively corresponding to the j upper bit lines and respectively adjacent to the j lower second bit lines, which are parallel to one another.

\* \* \* \* \*